(12) United States Patent
Lin et al.

(10) Patent No.: US 9,324,702 B2
(45) Date of Patent: Apr. 26, 2016

(54) PHOTOELECTRIC DEVICE

(71) Applicant: ADVANCED OPTOELECTRONIC TECHNOLOGY, INC., Hsinchu Hsien (TW)

(72) Inventors: Hou-Te Lin, Hsinchu (TW); Chao-Hsiung Chang, Hsinchu (TW); Pin-Chuan Chen, Hsinchu (TW); Lung-Hsin Chen, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 14/525,466

(22) Filed: Oct. 28, 2014

(65) Prior Publication Data
US 2015/0188013 A1 Jul. 2, 2015

(30) Foreign Application Priority Data
Dec. 27, 2013 (CN) .......................... 2013 1 0732635

(51) Int. Cl.
*H01L 33/62* (2010.01)
*H01L 27/02* (2006.01)
*H01L 25/16* (2006.01)
*H01L 33/48* (2010.01)

(52) U.S. Cl.
CPC .......... *H01L 27/0248* (2013.01); *H01L 25/167* (2013.01); *H01L 33/486* (2013.01); *H01L 2224/16245* (2013.01); *H01L 2224/48091* (2013.01); *H01L 2224/48247* (2013.01)

(58) Field of Classification Search
CPC . H01L 27/0248; H01L 25/167; H01L 33/486; H01L 2224/48247; H01L 2224/48091; H01L 2224/16245
See application file for complete search history.

(56) References Cited

U.S. PATENT DOCUMENTS

| 2007/0246729 | A1  | 10/2007 | Park |
| 2009/0189174 | A1  | 7/2009  | Lee et al. |
| 2011/0012151 | A1* | 1/2011  | Ono ...................... H01L 25/167 257/98 |
| 2011/0303941 | A1  | 12/2011 | Lee |
| 2012/0181569 | A1* | 7/2012  | Choi ...................... H01L 33/62 257/99 |

FOREIGN PATENT DOCUMENTS

| TW | 200721525 A | 6/2007 |
| TW | 201212296 A | 3/2012 |
| TW | 201334150 A | 8/2013 |

* cited by examiner

*Primary Examiner* — Yuanda Zhang
*Assistant Examiner* — Michael Carter
(74) *Attorney, Agent, or Firm* — Novak Druce Connolly Bove + Quigg LLP

(57) ABSTRACT

A photoelectric device includes a base, an LED (light emitting diode) element and a zener diode. The base includes a first electrode and a second electrode. The LED element and the zener diode are electrically connected with the first electrode and the second electrode. A recess structure is defined in the base. The zener diode is arranged in the recess structure. The zener diode is electrically connected in anti-parallel with the LED element.

14 Claims, 5 Drawing Sheets

PHOTOELECTRIC DEVICE

CROSS-REFERENCE TO RELATED APPLICATIONS

This application claims priority to Chinese Patent Application No. 201310732635.6 filed on Dec. 27, 2013, the contents of which are incorporated by reference herein.

FIELD

This disclosure relates to a photoelectric device, and particularly to a photoelectric device having a zener diode.

BACKGROUND

A zener diode is always arranged besides an LED (light emitting diode) element in an LED package to prevent the LED diode from electrostatic damage.

BRIEF DESCRIPTION OF THE DRAWINGS

Implementations of the present technology will now be described, by way of example only, with reference to the attached figures.

DETAILED DESCRIPTION OF EMBODIMENTS

It will be appreciated that for simplicity and clarity of illustration, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. In addition, the description is not to be considered as limiting the scope of the embodiments described herein. The drawings are not necessarily to scale and the proportions of certain parts have been exaggerated to better illustrate details and features of the present disclosure.

Figure 1:
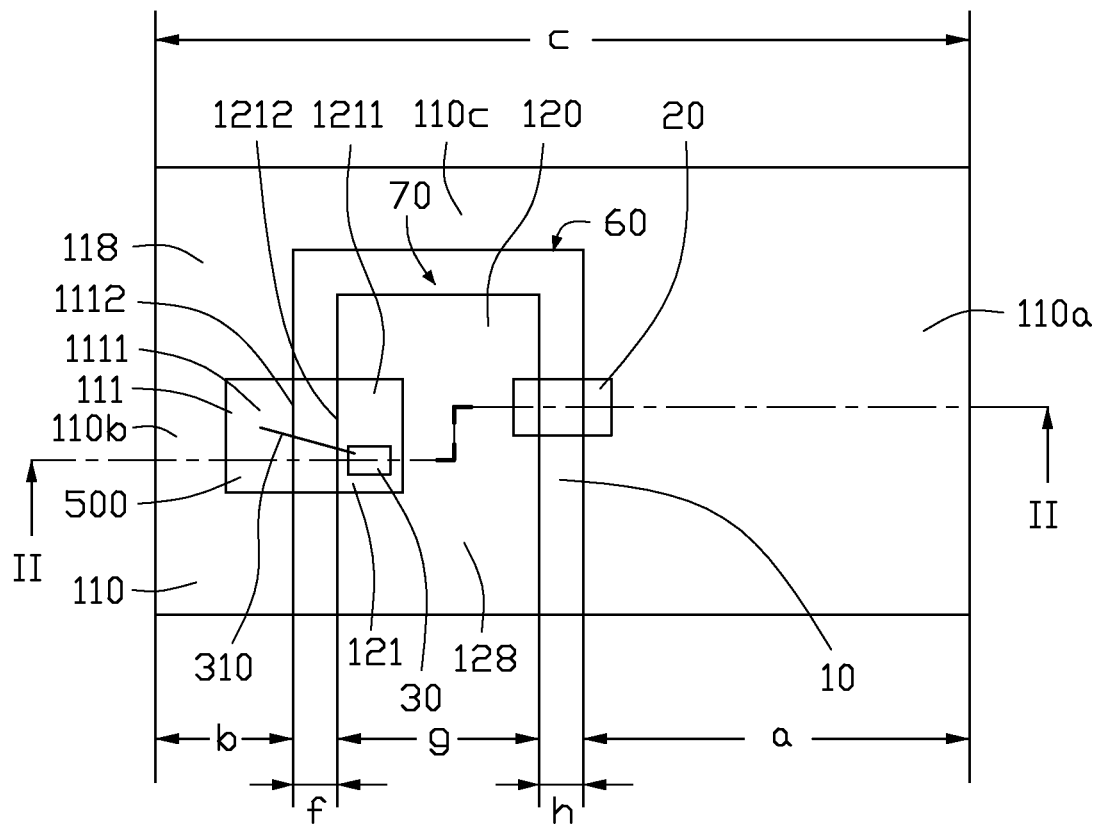
FIG. 1 is a diagrammatic view of a photoelectric device in accordance with an example embodiment of the present disclosure.
Figure 2:
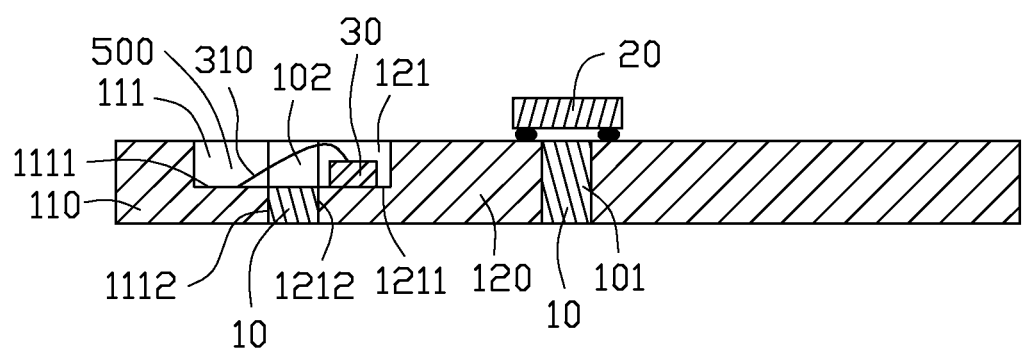
FIG. 2 is a cross-sectional view along II-II of the photoelectric device of FIG. 1.

Referring to FIGS. 1-2, a photoelectric device comprises a base 10 comprising a recess structure 500, an LED (light emitting diode) element 20, and a zener diode 30. The LED element 20 is arranged on the base 10. The zener diode 30 is arranged in the recess structure 500.

The base 10 comprises a first electrode 110 and a second electrode 120. Each of the first electrode 110 and the second electrode 120 extends from one surface of the base 10 to the other surface thereon. The first electrode 110 and the second electrode 120 are electrically insulated with each other. The LED element 20 and the zener diode 30 are electrically connected with the first electrode 110 and the second electrode 120. The LED element 20 and the zener diode 30 are electrically connected in anti-parallel with each other. The base 10 can be made of insulating material. The base 10 can be made of epoxy molding compound (EMC) or sheet molding compound (SMC).

The first electrode 110 surrounds the second electrode 120. The second electrode 120 can be a circle or ellipse shape, and the first electrode 110 can be an annulus shape and locate at periphery sides of the second electrode 120. The first electrode 110 can further have a gap, thereby surrounding part of the second electrode 120. In this embodiment, the first electrode 110 comprises a first arm 110a, a second arm 110b and a connecting arm 110c. The first arm 110a is spaced from the second arm 110b. The connecting arm 110c is connected between the first arm 110a and the second arm 110b. The first arm 110a and the second arm 110b are located at a side 60 of the connecting arm 110c. The first arm 110a and the second arm 110b are perpendicular to the connecting arm 110c. The first electrode 110 has a U-shaped configuration. An opening 70 is defined among the first arm 110a, the second arm 110b and the connecting arm 110c. The second electrode 120 is received in the opening 70.

The LED element 20 is electrically connected to the first arm 110a of the first electrode 110 and the second electrode 120. In at least one embodiment, the LED element 20 can be electrically connected to the first arm 110a of the first electrode 110 and the second electrode 120 by flip chip connection.

A sum of a half of a distance h between the first arm 110a and the second electrode 120 and a width a of the first arm 110a is equal to a half of length c of the connecting arm 110c. A sum of a width g of the second electrode 120, a width b of the second arm 110b and a distance f between the second arm 110b and the second electrode 120 is equal to the width a of the first arm 110a. In at least one embodiment, the distance f between the second arm 110b and the second electrode 120 is equal to a distance h between the first arm 110a and the second electrode 120.

The zener diode 30 is electrically connected to the second arm 110b of the first electrode 110 and the second electrode 120. In at least one embodiment, the zener diode 30 can be electrically connected to the second arm 110b of the first electrode 110 and the second electrode 120 by wires 310.

The recess structure 500 comprises a first recess 111 and a second recess 121. The first recess 111 is defined in the second arm 110b of the first electrode 110. The second recess 121 is defined in the second electrode 120. A channel 102 is defined between the first recess 111 and the second recess 121. In at least one embodiment, a first edge 1112 is defined in the second arm 110b of the first electrode 110. A second edge 1212 is defined in the second electrode 120. The first edge 1112 is opposite to the second edge 1212. The first recess 111 is defined in the first edge 1112 of the second arm 110b. The first recess 111 sinks down from a first top surface 118 of the second arm 110b and sinks inside from the first edge 1112 of the second arm 110b. The second recess 121 is defined in the second edge 1212 of the second electrode 120. The second recess 121 sinks down from a second top surface 128 of the second electrode 120 and sinks inside from the second edge 1212 of the second electrode 120. The first recess 111 is opposite to the second recess 121.

The zener diode 30 is received in the recess structure 500. A height of the zener diode 30 is less than a depth of the recess structure 500. In at least embodiment, the zener diode 30 can be received in the first recess 111 or the second recess 121. The height of the zener diode 30 is less than depths of the first recess 111 and the second recess 121. A first bottom surface 1111 is defined in the first recess 111. A second bottom surface 1211 is defined in the second recess 121. The zener diode 30 is arranged on one of the first bottom surface 1111 and the second bottom surface 1211 and electrically connected to the first recess 111 and the second recess 121. The zener diode 30 is electrically connected to the first bottom surface 1111 and the second bottom surface 1211. In at least one embodiment, the zener diode 30 can be electrically connected to the first bottom surface 1111 and the second bottom surface 1211 by wires 310. The wires 310 are received in the first recess 111 and the second recess 121.

Figure 3:
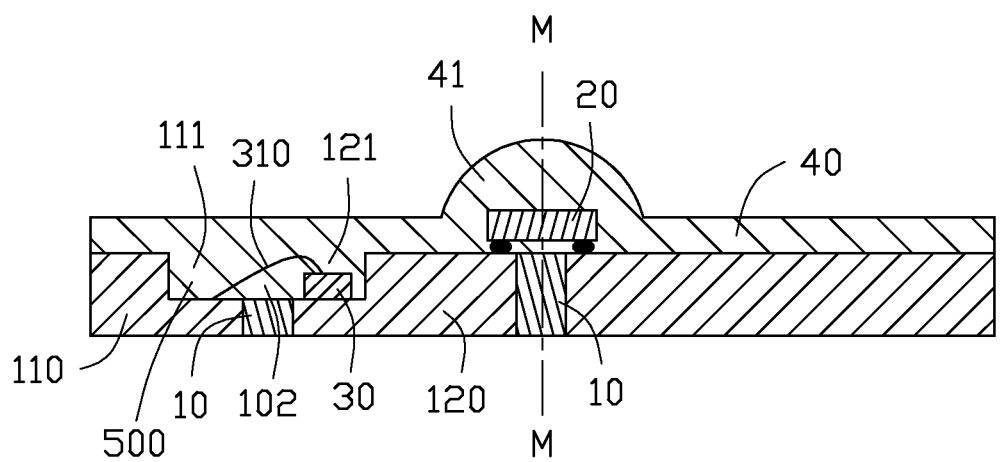
FIG. 3 is a cross-sectional view along II-II of the photoelectric device, wherein a first packaging structure covers an LED element and a zener diode of FIG. 1.

Referring to FIG. 3, the photoelectric device can comprise a first packaging structure 40. The first packaging structure 40 covers the LED element 20 and the zener diode 30. The first packaging structure 40 is filled in the recess structure 500. In this embodiment, the first packaging structure 40 can fill the first recess 111, the second recess 112 and the channel 102. The first packaging structure can comprise phosphor powders. The first packaging structure 40 can comprise a lens 41. The lens 41 covers the LED element 20. The lens 40 can comprise phosphor powders.

Figure 4:
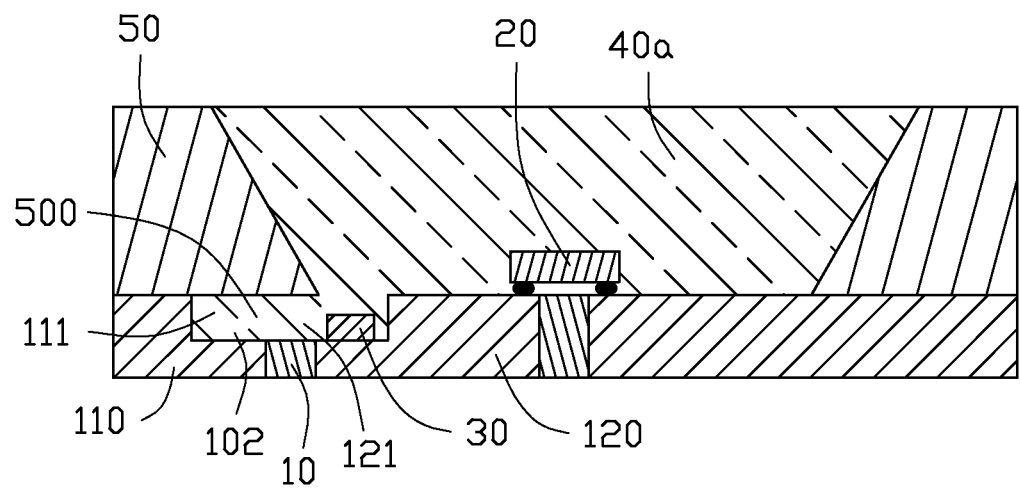
FIG. 4 is a cross-sectional view along II-II of the photoelectric device, wherein a reflective cup is formed on a base and a second packaging structure covers the LED element and the zener diode of FIG. 1.

Referring to FIG. 4, the photoelectric device can comprise a reflective cup 50 and a second packaging structure 40a. The reflective cup 50 is formed on the base 10. The LED element 20 is received in the reflective cup 50. The zener element 30 is arranged under the reflective cup 50. The second packaging structure 40a covers the LED element 20 and the zener diode 30. The second packaging structure 40a is filled in the reflective cup 50 and the recess structure 500. In this embodiment, the second packaging structure 40a can fill the reflective cup 50, the first recess 111, the second recess 112 and the channel 102. The second packaging structure 40a can comprise phosphor powders.

Figure 5:
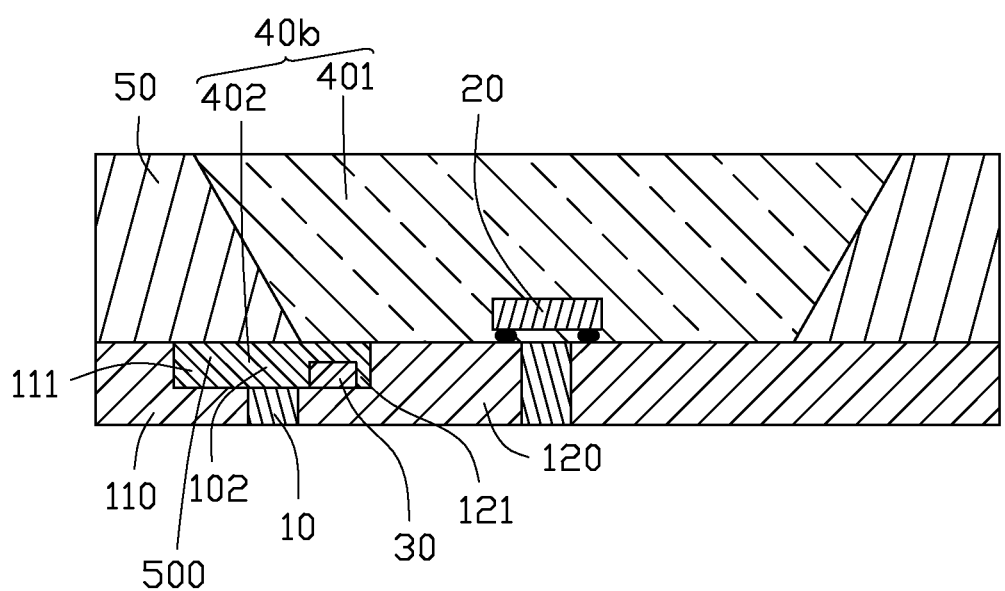
FIG. 5 is a cross-sectional view along II-II of the photoelectric device, wherein the reflective cup is formed on the base and a third packaging structure covers the LED element and the zener diode of FIG. 1.

Referring to FIG. 5, the photoelectric device can comprise a reflective cup 50 and a third packaging structure 40b. The reflective cup 50 is formed on the base 10. The LED element 20 is received in the reflective cup 50. The zener diode 30 is arranged under the reflective cup 50. The third packaging structure 40b comprises a first encapsulant 401 and a second encapsulant 402. The first encapsulant 401 is filled in the reflective cup 50 and covers the LED element 20. The first encapsulant 401 can comprise phosphor powders. The first encapsulant 401 can be made of transparent material. The second encapsulant 402 is filled in the recess structure 500 and covers the zener diode 30. In this embodiment, the second encapsulant 402 can fill the first recess 111, the second recess 112 and the channel 102. The second encapsulant can be made of non-transparent material.

It is to be further understood that even though numerous characteristics and advantages have been set forth in the foregoing description of embodiments, together with details of the structures and functions of the embodiments, the disclosure is illustrative only. Changes may be made in detail, including in matters of shape, size, and arrangement of parts within the principles of the disclosure to the full extent indicated by the broad general meaning of the terms in which the appended claims are expressed.

The embodiments shown and described above are only examples. Many details are often found in the art such as the other features of a photoelectric device and a method of manufacturing the photoelectric device. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A photoelectric device comprising:
   a base with a first electrode and a second electrode and defining a recess structure thereof in the base, the first electrode surrounding the second electrode, the first electrode comprising a first arm, a second arm and a connecting arm, the first arm spaced from the second arm, the connecting arm connected between the first arm and the second arm, an opening defined among the first arm, the second arm and the connecting arm, the second electrode received in the opening, the first arm and the second arm being perpendicular to the connecting arm, a sum of a half of a distance between the first arm and the second electrode and a width of the first arm being equal to a half of length of the connecting arm;
   an LED (light emitting diode) element arranged on the base and electrically connected with the first electrode and the second electrode; and
   a zener diode arranged in the recess structure and electrically connected with the first electrode and the second electrode and electrically connected in anti-parallel with the LED element.

2. The photoelectric device of claim 1, wherein the second electrode is a circle or ellipse shape, and the first electrode is an annulus shape and located at periphery sides of the second electrode.

3. The photoelectric device of claim 1, wherein the first arm and the second arm are located at a side of the connecting arm.

4. The photoelectric device of claim 1, wherein the LED element is electrically connected to the first arm of the first electrode and the second electrode.

5. The photoelectric device of claim 1, wherein the zener diode is electrically connected to the second arm of the first electrode and the second electrode.

6. The photoelectric device of claim 5, wherein the recess structure comprises a first recess with a first bottom surface defined in the second arm and a second recess with a second bottom surface defined in the second electrode, and the zener diode is arranged on the one of the first bottom surface and the second bottom surface and electrically connected to the first recess and the second recess.

7. The photoelectric device of claim 6, wherein the zener diode is electrically connected to the first bottom surface and the second bottom surface.

8. The photoelectric device of claim 6, wherein a channel is defined between the first recess and the second recess.

9. The photoelectric device of claim 1, wherein a height of the zener diode is less than a depth of the recess structure.

10. The photoelectric device of claim 1, further comprising a first packaging structure, wherein the first packaging structure covers the LED element and the zener diode and is filled in the recess structure.

11. The photoelectric device of claim 10, wherein the first packaging structure comprises a lens, the lens covers the LED element.

12. The photoelectric device of claim 1, further comprising a reflective cup formed on the base and a second packaging structure, wherein the LED element is received in the reflective cup, and the zener diode is arranged under the reflective, the second packaging structure covers the LED element and the zener diode and is filled in the reflective cup and the recess structure.

13. The photoelectric device of claim 1, further comprising a reflective cup formed on the base and a third packaging structure, wherein the LED element is received in the reflective cup, and the zener diode is arranged under the reflective cup, the third packaging structure comprises a first encapsulant and a second encapsulant, the first encapsulant is filled the reflective cup and covers the LED element, the second encapsulant is filled the recess structure and covers the zener diode.

14. A photoelectric device comprising:
   a base with a first electrode and a second electrode and defining a recess structure thereof in the base, the first electrode surrounding the second electrode, the first electrode comprising a first arm, a second arm and a connecting arm, the first arm spaced from the second arm, the connecting arm connected between the first arm and the second arm, an opening defined among the first arm, the second arm and the connecting arm, the second electrode received in the opening, the first arm and the second arm being perpendicular to the connecting arm, a sum of width of the second electrode, a width of the second arm and a distance between the second arm and the second electrode is equal to the width of the first arm;
   an LED (light emitting diode) element arranged on the base and electrically connected with the first electrode and the second electrode; and
   a zener diode arranged in the recess structure and electrically connected with the first electrode and the second electrode and electrically connected in anti-parallel with the LED element.

\* \* \* \* \*